United States Patent [19]

Chang et al.

[11] Patent Number: 5,763,313
[45] Date of Patent: Jun. 9, 1998

[54] PROCESS FOR FABRICATING SHIELD FOR POLYSILICON LOAD

[75] Inventors: Tsun-Tsai Chang, Hsinchu; Chen-Chung Hsu, Taichung, both of Taiwan

[73] Assignee: United Microelectronics Corp., Taiwan

[21] Appl. No.: 615,598

[22] Filed: Mar. 13, 1996

[51] Int. Cl.⁶ .................................. H01L 21/8244
[52] U.S. Cl. ............................ 438/385; 438/647
[58] Field of Search ......................... 438/210, 238, 438/384, 385, 647

[56] References Cited

U.S. PATENT DOCUMENTS

| | | | |
|---|---|---|---|
| 4,370,798 | 2/1983 | Lien et al. | 438/385 |
| 4,408,385 | 10/1983 | Mohan Rao et al. | 438/385 |
| 5,177,030 | 1/1993 | Lee et al. | 438/385 |
| 5,348,901 | 9/1994 | Chen et al. | 438/385 |

OTHER PUBLICATIONS

Ghandhi, "VLSI Fabrication Principles, Silicon and Gallium Arsenide", pp. 420–424, 427–429, 432–435, 1983.

*Primary Examiner*—Chandra Chaudhari
*Attorney, Agent, or Firm*—Ladas & Parry

[57] ABSTRACT

A process for fabricating a protective shield for polysilicon loads in SRAM devices is disclosed. The protective shield enables to protect the polyloads from resistance characteristics degradation during the subsequent plasma-based processing steps in the fabrication of the memory device after the polyloads are formed. The polyloads are formed in a photolithography procedure by utilizing a photomask defining the resistive and conductive portions of the polyloads. The process comprises the steps of forming a shield silicon oxide layer over the surface of the memory device in process, including the polyloads, and forming a shield silicon nitride layer on the top of the shield silicon oxide layer. The protective shield is then formed by etching in the shield silicon oxide and nitride layers utilizing a protective photomask. The protective photomask is the same photomask utilized in the formation of the polyloads in the previous photolithography procedural step of the fabrication of the memory device.

4 Claims, 3 Drawing Sheets

PROCESS FOR FABRICATING SHIELD FOR POLYSILICON LOAD

BACKGROUND OF THE INVENTION

1. Field of the Invention

The present invention relates in general to a process for the fabrication of semiconductor memory devices. In particular, the present invention relates to a process for fabricating the protective shield or shielding layer for the polysilicon load (polyload) in static random access memory (SRAM) devices. The shielding layer is used to protect the polyload from the resistance degradation normally caused by plasma etching procedures employed in the fabrication of the semiconductor memory devices.

2. Technical Background

The polysilicon loads, herein sometimes referred to as polyloads, are commonly found in SRAM devices as the resistive load elements that are fabricated through precision doping procedures in the manufacturing of these memory devices. Very similar to the structural configuration of conventional resistive elements, every polyload comprises generally two polysilicon portions with different characteristics of electrical conductivity. In particular, one of the two polysilicon portions constitutes the conductive portion of the polyload which is heavily doped with impurities. The other portion, on the other hand, is the highly resistive portion that is suitably doped.

To better understand the present invention, a typical conventional process for the fabrication of such polyload elements for semiconductor memory devices mentioned above is briefly examined herein with reference to FIGS. 1, 2 and 3 of the accompanying drawings of this application. As seen in FIG. 1, a P-type semiconductor silicon substrate 1, which serves as the basis for the fabrication of the semiconductor device, has the field oxide layers 10 formed in, for example, a LOCOS (local oxidation of silicon) procedure, so as to define the active region for the device. An oxide layer having a thickness of about 100 to 200 Å and a first polysilicon layer are formed subsequently over the designated area of the substrate 1 and are patterned in a photolithography procedure to form the gate oxide layers 16 and the gate electrodes 18, as shown in FIG. 1. Sidewall spacers 14 for the gate configuration are then formed along the sidewalls of the gate oxide layers 16 and gate electrodes 18, followed by the formation of the source/drain regions, each region comprising a heavily-doped region 12a and a lightly-doped region 12b.

Next, as seen in FIG. 2, an insulation oxide layer 20 having a thickness of about 2,000 Å is then formed over the surface of the substrate 1 including the above mentioned structure at this stage. Then, a second polysilicon layer having a thickness of about 800 Å is further deposited over the top surface of the insulation oxide layer 20. The second polysilicon layer will be shaped into the polyload or polyloads in the subsequent fabrication procedures.

To fabricate the polyload, an impurity implantation procedure is conducted with predetermined relatively low dose in the designated resistive portion or portions of the polyloads. This is done by conducting the lightly-doping procedure against the second polysilicon layer deposited over the surface of the oxide layer 20. Afterwards, a polyload mask is then employed to define and pattern the polyload 22 by etching. Then, another polyload mask or photomask is utilized to define the resistive and conductive portions in the polyload 22, followed by the implementation of ion implantation procedure so as to allow the conductive portion of the polyload 22 to acquire its required conductance characteristics. In FIG. 2, the longitudinal orientation of the polyload 22 is generally perpendicular to the plane of the drawing.

Referring next to FIG. 3, a layer of borophosphosilicate glass (BPSG) 24 is then deposited over the surface of the device configuration shown in FIG. 2 and the layer density thereof is increased. Sputter-coating and etching procedures are then employed to form the layer for metal lines 27 on the BPSG layer 24. The fabrication procedural steps that follow, such as the deposition of inter-metal dielectric layer 26, the shaping of the metal contact openings (not shown in the drawing), and the deposition of the passivation (which includes plasma-enhanced oxide layer 28 and plasma-enhanced silicon nitride layer 30), are subsequently performed, and the semiconductor structural configuration of an SRAM device may thus be generally established.

In the process of making the polyload for the memory device as described above, the dose of the ion implantation in the resistive portion of the polyload 22 must be controlled with great precision. This is required for the resistive portion to maintain its characteristics of high resistance. However, the resistive portion of the polyload having the high resistance characteristics is susceptible to the disadvantageous influence by the effects of the plasma-based procedures employed in the subsequent fabrication procedural steps. For example, the plasma-enhanced CVD and plasma etching (i.e., dry etching) procedures, that are necessarily to be conducted after the formation of the polyload, are likely to degrade the high resistance characteristics of the resistive portion of the formed polyload. This is resulted from the phenomena of ion intrusion in those plasma-based procedural steps. The reduction of the resistance characteristics degradation in the polyloads of these static memory devices has become a major concern in the fabrication of the memory devices, which are now required to be fabricated into much faster and greater storage density devices. As a piece of prior art representing the efforts made, Lee et. al. in their U.S. Pat. No. 5,177,030, "Method of Making Self-Aligned Vertical Intrinsic Resistance," disclosed a vertical polysilicon resistor with highly conductive polysilicon contacts to the resistor formed thereover.

SUMMARY OF THE INVENTION

It is therefore the primary object of the present invention to provide a process for fabricating the protective shield for the polysilicon load in semiconductor static memory devices to protect the load from the resistance characteristics degradation.

It is another object of the present invention to provide a process for fabricating the protective shield for the polysilicon load in semiconductor static memory devices to protect the load from the resistance characteristics degradation without the need to utilize additional processing mask.

The present invention achieves the above-identified objects by providing a process for fabricating a protective shield for polysilicon loads in SRAM devices. The protective shield enables to protect the polyloads from the resistance characteristics degradation that may otherwise be caused in subsequent plasma-based processing steps in the fabrication of the memory device after the polyloads are formed. The polyloads are formed in a photolithography procedure that utilizes a photomask for the definition of the resistive and conduct portions of the polyloads. The process comprises the steps of first forming a shield silicon oxide layer over the surface of the memory device then in process, including the polyloads, followed by the formation of another shield silicon nitride layer further on the top of the silicon oxide layer. The process then forms the protective shield for the polyloads by etching in the shield silicon oxide and nitride layers utilizing a protective photomask. The protective photomask is the very same photomask utilized in defining the resistive and conductive portions of the polyloads in the previous photolithography procedural step for the fabrication of the memory device.

In another aspect, the present invention achieves the above-identified objects by providing a process for fabrications the protective shield that enables to protect the polyloads from the resistance characteristics degradation that would otherwise occur in the plasma-based processing steps for the fabrication of the memory device after the polyloads are formed. The process comprises the steps of forming a shield dielectric layer over the surface of the memory device then in process, including the polyloads. The process then forms the protective shield for the polyloads by etching in the shield silicon oxide and nitride layers utilizing a protective photomask. The protective photomask is the same photomask utilized in the definition of the resistive and conductive portions of the polyloads in the previous photolithography procedural step for the fabrication of the memory device.

BRIEF DESCRIPTION OF THE DRAWINGS

Other objects, features, and advantages of the present invention will become apparent by way of the following detailed description of the preferred but non-limiting embodiments. The description is made with reference to the accompanying drawings in which.

DETAILED DESCRIPTION OF THE PREFERRED EMBODIMENT

Figure 1:
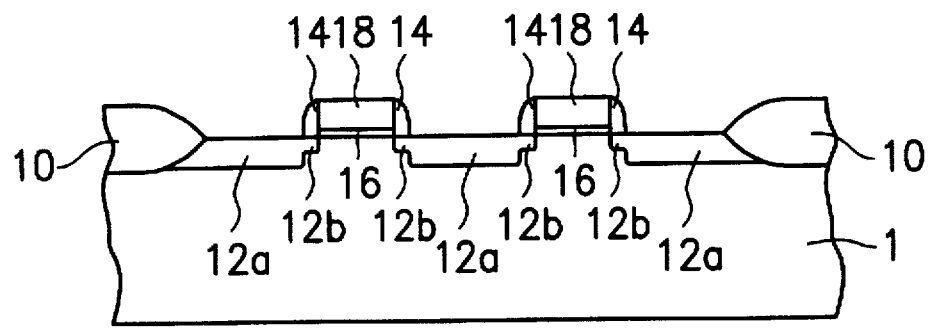
FIGS. 1 to 3 respectively show the cross-sectional views of the relevant portion of a typical prior art SRAM device in the process of fabrication as depicted from selected stages of the process of fabrication.
Figure 2:
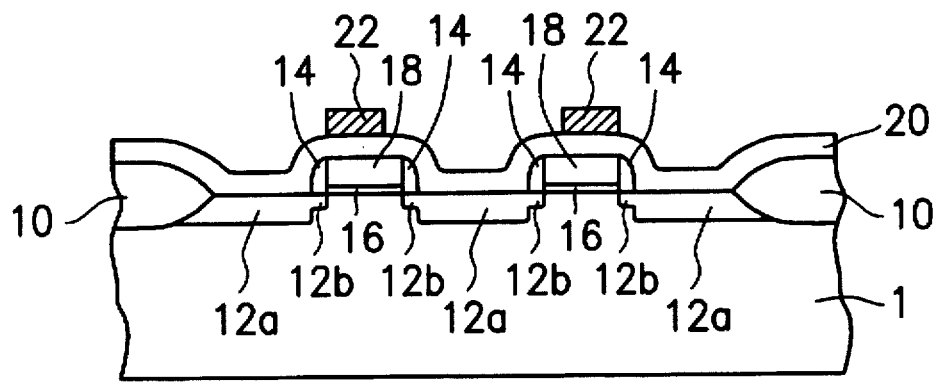

A preferred embodiment of the present invention is described herein. The process of the present invention for fabricating a protective shield for polyloads of semiconductor SRAM memory devices is generally based on the conventional process of the fabrication of the semiconductor memory devices as exemplified above with reference to FIGS. 1 to 3. In particular, the process of the present invention is employed after the initial procedural steps of fabrication that are essentially similar to those discussed above and shown in FIGS. 1 to 2. Therefore, the initial procedural steps of the fabrication of the semiconductor memory device up to the formation of polyloads 22 as shown in FIG. 2 will not be elaborated again. Rather, the description concentrates on the process of the invention with reference to FIGS. 4 to 6.

Thus, after the formation of the polyloads 22 as shown in FIG. 2, the process of the present invention continues with the deposition of a shielding silicon oxide layer 40 over the polyloads 22, followed by the formation of a shielding silicon nitride layer 42 on the top of the shielding silicon oxide layer 40. The two shielding layers 40 and 42 have a thickness of about 500 to 1,000 Å. These two shielding layers 40 and 42 will be utilized as the material for forming the protective shield for the polyloads 22 underneath once these shielding layers are shaped into the appropriate patterns in the subsequent fabrication procedural steps.

Figure 4:
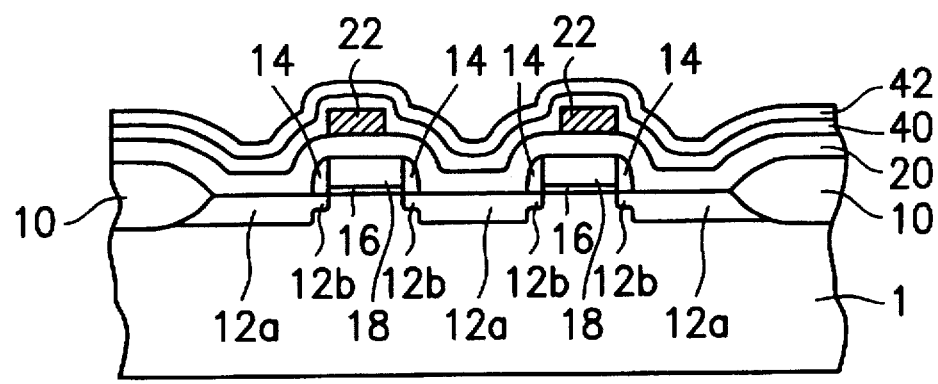
FIGS. 4 to 6 respectively show the cross-sectional views of the relevant portion of the SRAM device in the process of fabrication as depicted from selected stages of the process of fabrication in accordance with a preferred embodiment of the present invention.
Figure 5:
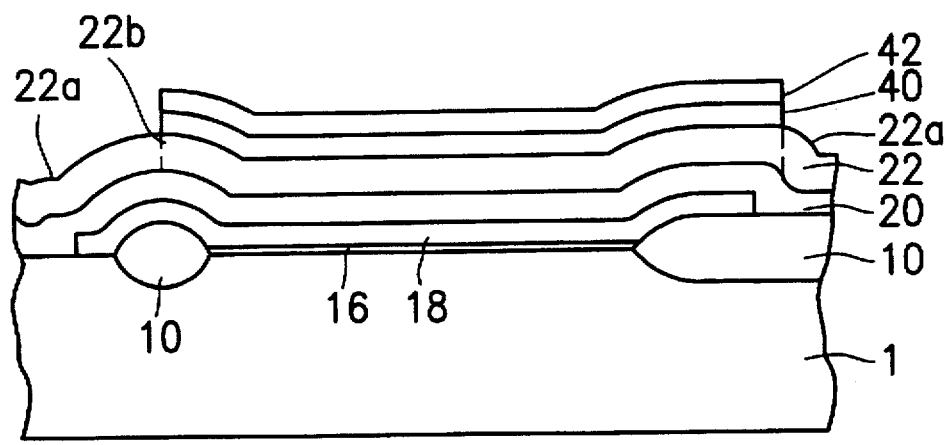
Figure 6:
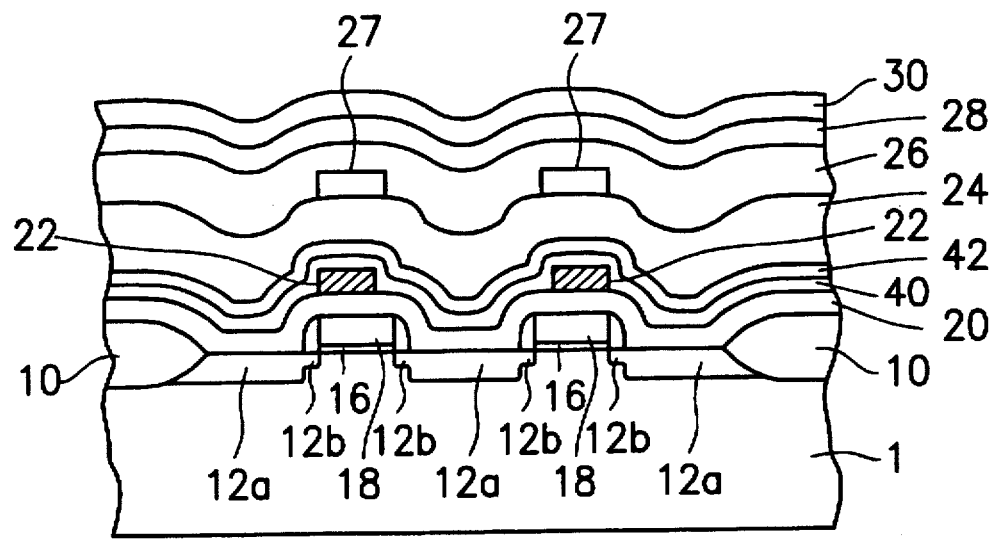

As discussed above, the formation of the polyloads 22 in the previous stages involves the use of a photomask that defines the resistive and conductive portions of the polyloads. This very same photomask may now be used again to define the pattern in the shielding silicon oxide and nitride layers 40 and 42 respectively in a further photolithography procedure so as to form the shielding configuration in these two shielding layers as shown in FIGS. 4 and 5 respectively. However, it should be pointed out that FIG. 4 is the cross-sectional view of the fabricated memory device taken at the same location as that of FIG. 2, while FIG. 5 shows the cross-sectional view of the device at the same fabrication procedural stage as that of FIG. 4 but is taken along a line perpendicular to that for FIG. 4.

Thus, a dielectric configuration is formed by the shaped shielding silicon oxide layer 40 and shielding nitride layer 42 as shown in FIGS. 4 and 5. This dielectric configuration may now be used as the protective shield or shielding mask for the polyloads 22 during the subsequent fabrication procedural steps of the semiconductor memory device, that is, the plasma-based fabrication procedures employed therein. The shielding silicon oxide and nitride layers 40 and 42 respectively serve to block the diffusion of the plasma material into the polyloads when the plasma-based processing commenced. The diffusion of the plasma material into the polyloads 22 would cause the undesirable degradation of the resistive characteristics of the polyloads, if the diffusion cannot be avoided.

This invention, however, can successfully avoid the diffusion and thus prevent the degradation of resistance characteristics. In the device configuration constructed in accordance with the preferred embodiment of the present invention, such resistance characteristics degradation in the polyloads can be prevented by the presence of the dielectric shielding configuration of the shielding silicon oxide and nitride layers 40 and 42. These shielding layers protect the polyloads from the undesirable plasma diffusion.

It should be understood that the use of the double-layer shielding configuration, such as the use of the silicon oxide and silicon nitride layers 40 and 42, is not the only solution for the fabrication of the protective shield or shielding mask of the polyloads against the plasma diffusion. It can be easily appreciated by persons skilled in the art that the silicon nitride layer 42 may be replaced by, for example, another polysilicon layer. This will provide substantially the same protection for the polyloads by the silicon oxide and nitride double layers. Further, a single dielectric shielding layer, either the silicon oxide layer 40 or nitride layer 42, can be used. The effect of the protection for the polyloads against the plasma diffusion by the single layer would also be substantially the same as that of the double layers. Therefore, the use of a single shielding layer and the replacement of the silicon nitride layer by a polysilicon layer as described above should be considered as variants of this invention. They are still within the scope of the present invention.

Figure 3:
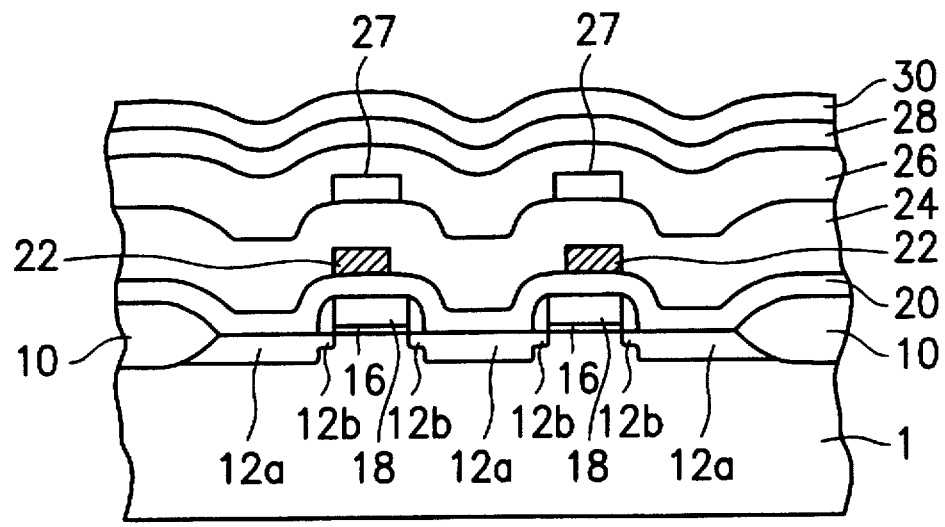

After the formation of the polyload protective shielding layer as described above, the fabrication procedures of the semiconductor memory device using the process of the present invention would again be substantially the same as those shown in FIG. 3 of the prior art memory devices. Hence, no elaboration of those procedural steps will be made herein.

According to the present invention, the process for fabricating of the protective shield for the polyloads in the semiconductor static memory devices as described above can have at least the following advantages. First, the protective shield for the precision polyloads in the memory devices can effectively prevent the loads from the undesirable degradation of the resistance characteristics thereof. This is an important factor for the reliability and power consumption of the static memory devices fabricated. As persons skilled in the art may well be aware of, the degradation of the resistance characteristics in the polyloads indicates the increase of the memory device operating current, which is directly reflected in the increase of the power consumption of the memory device. Secondly, this satisfactory protection is achieved without excessive effort of developing additional photomask but by using a mask already in existence. This means the fabricated static memory devices may be able to exhibit better performance characteristics without noticeable increase in cost.

In sum, the present invention has been described by way of description of the preferred embodiment. However, it must be understood that the invention should not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A process for fabricating a protective shield for polysilicon loads in a semiconductor static memory device, said shield capable of protecting said polysilicon loads from resistance characteristics degradation during subsequent plasma processing steps in the fabrication of said memory device after said polysilicon loads are formed in a photolithography procedure utilizing a photomask defining said polysilicon loads, said process comprising the steps of:

forming a shield silicon oxide layer over a surface of said memory device in process, including the polysilicon loads formed therein;

forming a shield silicon nitride layer atop said shield silicon oxide layer; and forming said protective shield by etching in said shield silicon oxide layer and said shield silicon nitride layer utilizing a protective photomask.

2. The process of claim 1, wherein said protective photomask is the photomask utilized in the formation of said polysilicon loads in the previous photolithography procedural step of the fabrication of said memory device.

3. A process for fabricating a protective shield for polysilicon loads of a semiconductor static memory device, said shield capable of protecting said polysilicon loads from resistance characteristics degradation during subsequent plasma processing steps in the fabrication of said memory device after said polysilicon loads are formed in a photolithography procedure utilizing a photomask defining said polysilicon loads, said process comprising the steps of:

forming a shield silicon oxide layer over a surface of said memory device in process, including the polysilicon loads formed therein;

forming a shield polysilicon layer atop said shield silicon oxide layer; and forming said protective shield by etching in said shield silicon oxide layer and said shield polysilicon layer utilizing a protective photomask.

4. The process of claim 3, wherein said protective photomask is the photomask utilized in the formation of said polysilicon loads in the previous photolithography procedural step of the fabrication of said memory device.

* * * * *